United States Patent [19]

Nomura et al.

[11] Patent Number: 5,212,279
[45] Date of Patent: May 18, 1993

[54] HOT-MELT ADHESIVE AND ITS USE IN POLYIMIDE FILM AND PRINTED CIRCUIT BOARD

[75] Inventors: Yoshihiro Nomura, Ichihara; Takashi Morinaga, Chiba; Toshiaki Fukushima, Shizuoka; Hiroshi Minamisawa, Ichihara; Kazuhito Hanabusa, Fuji, all of Japan

[73] Assignee: Hitachi Chemical Co., Ltd., Tokyo, Japan

[21] Appl. No.: 600,725

[22] Filed: Oct. 22, 1990

[51] Int. Cl.$^5$ ............... C08G 73/10; C08G 69/26; B32B 15/08; B32B 27/06
[52] U.S. Cl. ................... 528/184; 528/125; 528/128; 528/170; 528/171; 528/172; 528/173; 528/174; 528/176; 528/179; 528/185; 528/188; 528/220; 528/226; 528/229; 528/310; 528/331; 528/332; 528/350; 528/351; 528/352; 528/353; 428/458; 428/473.5; 428/901
[58] Field of Search ........... 528/125, 128, 170–171, 528/174, 176, 172, 173, 178, 184, 220, 229, 185, 226, 350, 351, 310, 332, 331, 353, 352, 176, 188; 428/473.5, 901, 548

[56] References Cited

U.S. PATENT DOCUMENTS

| | | | |
|---|---|---|---|
| 4,448,957 | 5/1984 | Nagaoka | 528/352 |
| 4,847,349 | 7/1989 | Ohta et al. | 528/125 |
| 4,861,855 | 8/1989 | Bockrath et al. | 528/185 |
| 4,864,008 | 9/1989 | Murata et al. | 528/125 |
| 4,880,895 | 11/1989 | Higashi et al. | 528/126 |
| 4,883,718 | 11/1989 | Ohta et al. | 528/125 |
| 4,908,409 | 3/1990 | Oikawa et al. | 528/353 |
| 4,923,968 | 5/1990 | Kunimune et al. | 528/353 |
| 4,954,612 | 9/1990 | Nomura et al. | 528/352 |
| 4,970,292 | 11/1990 | Bockrath et al. | 528/353 |
| 4,973,661 | 11/1990 | Lee et al. | 528/353 |
| 4,977,232 | 12/1990 | Maruyama et al. | 528/185 |

FOREIGN PATENT DOCUMENTS 58-37621  5/1983  Japan .

OTHER PUBLICATIONS

CA 112(18):160076p.

Primary Examiner—John Kight, III
Assistant Examiner—P. Hampton-Hightower
Attorney, Agent, or Firm—Antonelli, Terry, Stout & Kraus

[57] ABSTRACT

A hot-melt adhesive comprising a special polyamideimide or polyamide is excellent in heat resistance and adhesive strength and usable for providing substrates for printed circuit boards.

41 Claims, No Drawings

HOT-MELT ADHESIVE AND ITS USE IN POLYIMIDE FILM AND PRINTED CIRCUIT BOARD

BACKGROUND OF THE INVENTION

This invention relates to a hot-melt adhesive, a hot-melt adhesive in the form of a sheet, a polyimide film having a layer or layers of the hot-melt adhesive on one side or both sides thereof, a substrate for flexible printed circuit boards obtained by adhering metal foils to a polyimide film via a hot-melt adhesive layer, and a substrate for metal-based printed circuit boards obtained by adhering metal foils to a metal plate via a hot-melt adhesive layer.

Substrates for flexible printed circuit boards have been produced by adhering metal foils to a polyimide film via an insulating adhesive layer. On the other hand, substrates for metal-based printed circuit boards which are excellent in heat dissipation have teen produced by adhering metal foils to a metal plate made of, for example, aluminum, steel, etc. via an insulating adhesive. In the field of electronics, materials having good high temperature properties and good workability are required. Further, as the insulating adhesive, there are required materials having good heat resistance, good adhesive strength and capable of adhering in a short time.

Epoxy resins, modified epoxy resins, phenolic resins and acrylic resins which have been used as such an adhesive have a defect in that they are poor in heat resistance.

On the other hand, polyimide resins are known as resins having excellent heat resistance. But since the polyimide resins do not dissolve and are not melted, they are not suitable for adhesives. When a polyamide acid which is a precursor of a polyimide is used, it should be used in the form of a solution obtained by dissolving it in a solvent, followed by removal of the solvent and imidazation. During the removal of the solvent and imidazation, voids are easily formed due to condensation water. Further since high temperature and long time are necessary for the imidazation, there are many limitations in practical use. Due to these problems, the polyimide resins are not used practically.

SUMMARY OF THE INVENTION

It is an object of the present invention to provide a hot-melt adhesive excellent in heat resistance and adhesive strength as well as being able to be carried out hot-melt adhesion. It is another object of the present invention to use the hot-melt adhesive for bonding polyimide films, metals and metal foils to provide substrates for printed circuit boards excellent in heat resistance.

The present invention provides a hot-melt adhesive comprising at least one member selected from the group consisting of a polymer having repeating units of the formula:

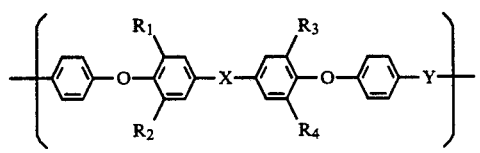

(I)

wherein $R_1$, $R_2$, $R_3$ and $R_4$ are independently a hydrogen atom, a lower alkyl group, a lower alkoxy group or a halogen atom; X is the same or different group in every repeating unit and is a direct link, —O—, —S—,

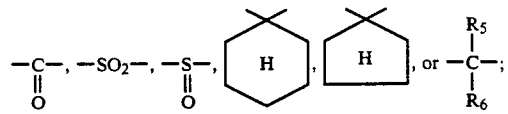

$R_5$ and $R_6$ are independently a hydrogen atom, a lower alkyl, group, a trifluoromethyl group, a trichloromethyl group or a phenyl group; Y is the same or different group in every repeating unit and represented by the formula:

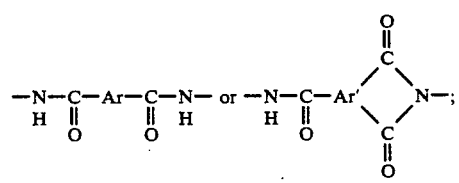

Ar is a divalent aromatic group; Ar' is a trivalent aromatic group, and a polymer having repeating units of the formula:

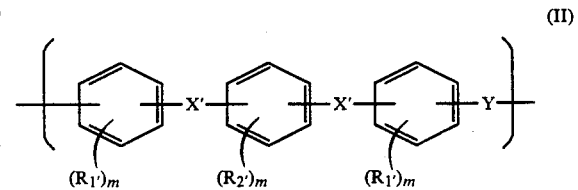

(II)

wherein m is zero or an integer of 1 to 4; $R_1'$ is a lower alkyl group; $R_2'$ is a lower alkyl group or a halogen atom; X' is the same or different group in every repeating unit and is a direct link, —O— or

$R_5'$ and $R_6'$ are independently a hydrogen atom, a lower alkyl group, a trifluoromethyl group or a phenyl group; and Y is as defined above.

The present invention also provides a polyimide film having a layer or layers of the hot-melt adhesive mentioned above on one side or both sides thereof.

The present invention further provides a substrate for flexible printed circuit boards obtained by adhering metal foils to a polyimide film via the hot-melt adhesive mentioned above.

The present invention still further provides a substrate for metal-based printed circuit boards obtained by adhering metal foils to a metal plate via the hot-melt adhesive mentioned above.

DESCRIPTION OF THE PREFERRED EMBODIMENTS

The hot-melt adhesive of the present invention comprises at least one member selected from the group consisting of a polymer having repeating units of the formula:

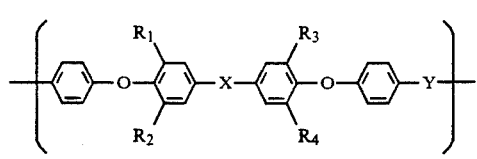

and a polymer having repeating units of the formula:

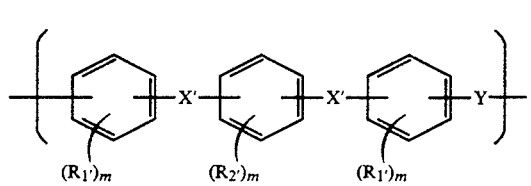

In the formulae (I) and (II), $R_1$, $R_2$, $R_3$ and $R_4$ are independently a hydrogen atom, a lower alkyl group preferably having 1 to 4 carbon atoms, a lower alkoxy group preferably having 1 to 4 carbon atoms, or a halogen atom; X is the same or different group in every repeating unit and is a direct link, —O—, —S—,

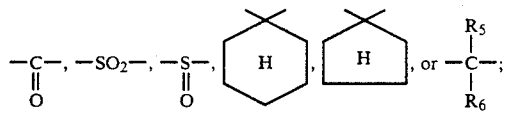

$R_5$ and $R_6$ are independently a hydrogen atom, a lower alkyl group preferably having 1 to 4 carbon atoms, a trifluoromethyl group, a trichloromethyl group or a phenyl group; Y is the same or different group in every repeating unit and represented by the formula:

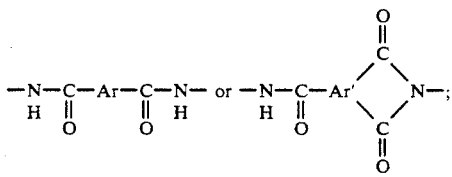

Ar is a divalent aromatic group such as

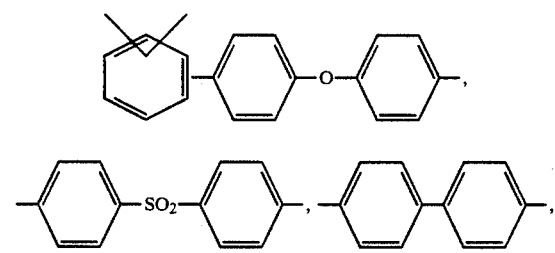

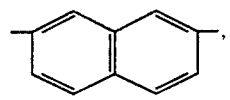

etc.; Ar' is a trivalent aromatic group such as etc.; $Ar^1$ is a trivalent aromatic group such as

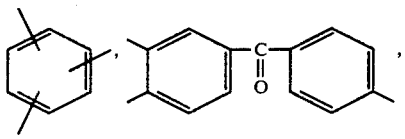

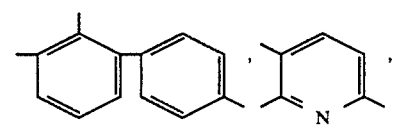

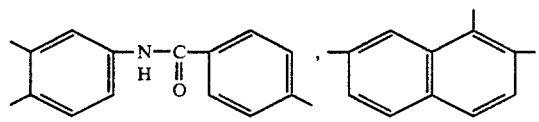

etc.; m is zero or an integer of 1 to 4; $R_1'$ is a lower alkyl group preferably having 1 to 4 carbon atoms; $R_2'$ is a lower alkyl group preferably having 1 to 4 carbon atoms or a halogen atom; X' is the same or different group in every repeating unit end is a direct link, —O— or

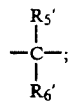

and $R_5'$ and $R_6'$ are independently a hydrogen atom, a lower alkyl group preferably having 1 to 4 carbon atoms, a trifluoromethyl group or a phenyl group.

Preferable examples of the repeating units of the formula (I) are as follows.

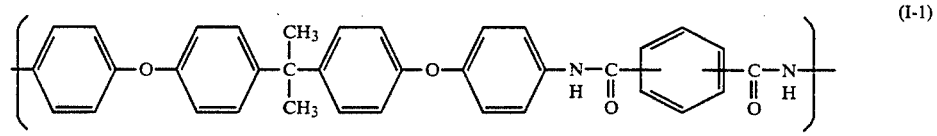

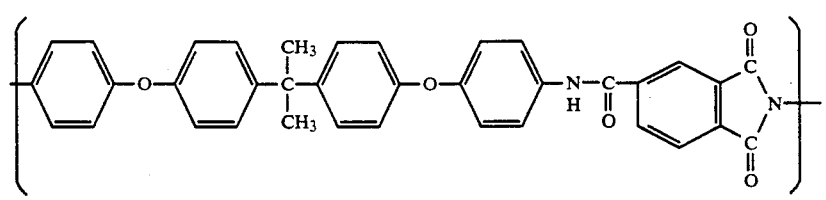
(I-2)
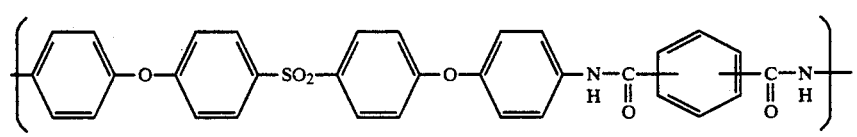
(I-3)
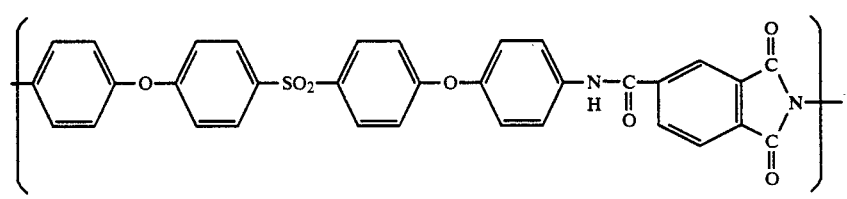
(I-4)
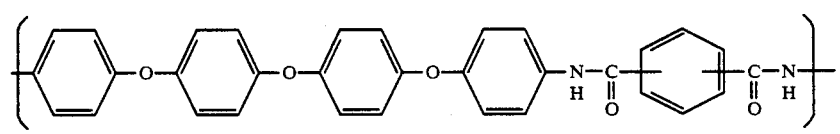
(I-5)
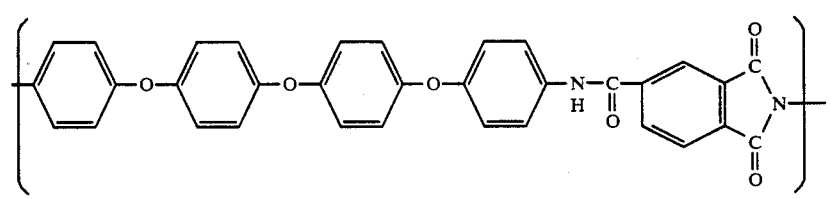
(I-6)
Preferable examples of the repeating units of the formula (II) are as follows.
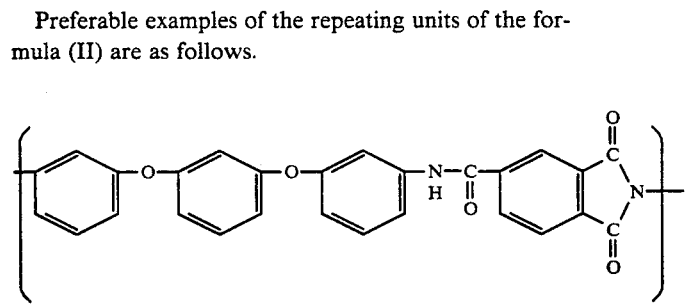
(II-1)
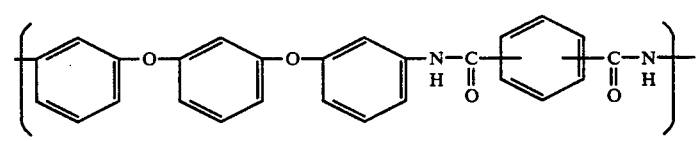
(II-2)
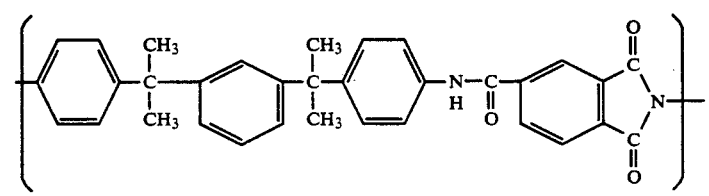
(II-3)

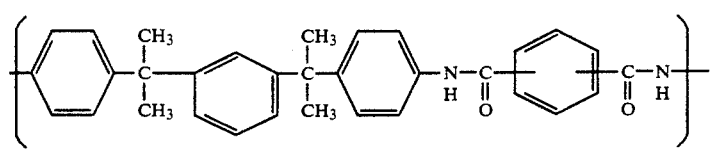

(II-4)

The polymer having the repeating units of the formula (I) or (II) can be obtained by polycondensation of an aromatic dicarboxylic acid or a reactive derivative thereof and/or an aromatic tricarboxylic acid or a reactive derivative thereof, and an aromatic diamine of the formula:

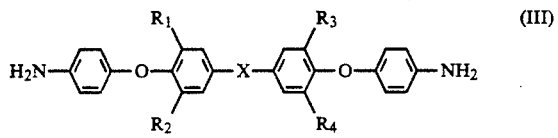

wherein $R_1$, $R_2$, $R_3$, $R_4$ and X are as defined above, or an aromatic diamine of the formula:

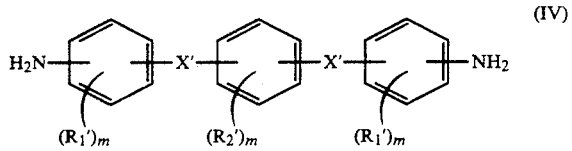

wherein $R_1'$, $R_2'$, X and m are as defined above.

The aromatic dicarboxylic acid has two carboxylic groups bonded to one or more aromatic nuclea (rings). the aromatic rings may include a heterocyclic ring. Further, aromatic rings can be bonded via an alkylene group, an oxygen, atom, a carbonyl group or the like. Further, substituents which do not pertain to the condensation reaction such as an alkoxy group, an allyloxy group, an alkylamino group, a halogen atom, or the like can be introduced into the aromatic rings.

Examples the aromatic dicarboxylic acid are terephthalic acid, isophthalic acid, 4,4'-diphenylether dicarboxylic acid, 4,4'-diphenylsulfone dicarboxylic acid, 4,4'-diphenyl dicarboxylic acid, 1,5-naphthalene dicarboxylic acid, etc. Among them, the use of terephthalic acid and isophthalic acid are preferable due to being easily available.

As the reactive derivative of the aromatic dicarboxylic acid, there can be used a dichloride of an aromatic dicarboxylic acid, a dibromide of an aromatic dicarboxylic acid, a diester of an aromatic dicarboxylic acid, etc.

The aromatic tricarboxylic acid has three carboxylic groups bonded to one or more aromatic nuclea (rings), and two of the three carboxylic groups are bonded to neighboring carbon atoms. The aromatic rings may include a heterocyclic ring. The aromatic rings can be bonded via an alkylene group, an oxygen atom, a carbonyl group, or the like. Further, substituents which do not pertain to the condensation reaction such as an alkoxy group, an allyloxy group, an alkylamino group, a halogen atom, or the like can be introduced into the aromatic rings.

Examples of the aromatic tricarboxylic acid are trimellitic acid, 3,4,4'-benzophenonetrizarboxylic acid, 2,3,4'-diphenyltricarboxylic acid, 2,3,6-pyridinetricarboxylic acid, 3,4,4'-benzanilidotricarboxylic acid, 1,4,5-naphthalenetricarboxylic acid, 2'-methoxy-3,4,4'-diphenyl ether tricarboxylic acid, 2'-chlorobenzanilido-3,4,4'-tricarboxylic acid, etc.

As the reactive derivative of the aromatic tricarboxylic acid, there can be used an acid anhydride, a halide, an ester, an amide, an ammonium salt, and the like of the aromatic tricarboxylic acid. Examples of these compounds are trimellitic anhydride, trinellitic anhydride monochloride, 1,4-dicarboxy-3-N,N-dimethylcarbamoylbenzene, 1,4-dicarbomethoxy-3-carboxybenzene, 1,4-dicarboxy-3-carbophenoxybenzene, 2,6-dicarboxy-3-carbomethoxypyridine, 1,6-dicarboxy-5-carbamoylnaphthalene, ammonium salts such as ammonia, dimethylamine, triethylamine, and the like salts of the abovementioned aromatic tricarboxylic acids. Among them, trimellitic anhydride and trimellitic anhydride monochloride are preferable.

Examples of the aromatic diamine of the formula (III) are as follows.

2,2-bis[4-(4-aminophenoxy)phenyl]propane,
2,2-bis[3-methyl-4-(4-aminophenoxy)phenyl]propane,
2,2-bis[4-(4-aminophenoxy)phenyl]butane,
2,2-bis[3-methyl-4-(4-aminophenoxy)phenyl]butane,
2,2-bis[3,5-dimethyl-4-(4-aminophenoxy)phenyl]butane,
2,2-bis[3,5-dibromo-4-(4-aminophenoxy)phenyl]butane,
1,1,1,3,3,3-hexafluoro-2,2-bis[3-methyl-4-(4-aminophenoxy)phenyl]propane,
1,1,1,3,3,3-hexafluoro-2,2-bis[4-(4-aminophenoxy)phenyl]propane,
1,1-bis[4-(4-aminophenoxy)phenyl]cyclohexane,
1,1-bis[4-(4-aminophenoxy)phenyl]cyclopentane,
bis[4-(4-aminophenoxy)phenyl]sulfone,
bis[4-(4-aminophenoxy)phenyl]ether,
bis[4-(3-aminophenoxy)phenyl]sulfona,
4,4'-carbonylbis(p-phenylenoxy)dianiline,
4,4'-bis(4-aminophenoxy)biphenyl, etc.

These compounds can be used alone or as a mixture thereof.

Examples of the aromatic diamine of the formula (IV) are as follows.

1,3-bis(3-aminophenoxy)benzene,
1,3-bis(4-aminophenoxy)benzene,
1,4-bis(4-aminophenoxy)benzene,
1,3-bis(5-methyl-3-aminophenoxy)benzene,
1,3-bis(5-methyl-4-aminophenoxy)benzene,
1,4-bis(5-methyl-4-aminophenoxy)benzene,
1,4-bis(3-aminophenoxy)benzene,
4,4'-[1,3-phenylenebis(1-methylethylidene)]bisaniline,
4,4'-[1,4-phenylenebis(1-methylethylidene)]bisaniline,
3,3'-[1,3-phenylenebis(1-methylethylidene)]bisaniline, etc.

These compounds can be used alone or as a mixture thereof. Among them, 1,3-bis(3-aminophenoxy)benzene and 4,4'-[1,3-phenylenebis(1-methylethylidene)]bisaniline are preferable.

It is possible to use other known diamines such as 4,4'-diaminodiphenyl ether, 4,4'-diaminodiphenylmethane, 4,4'-diaminodiphenylsulfone, metaphenylenediamine, piperazine, hexamethylenediamine, heptamethylenediamine, tetramethylenediamine, p-xylilenediamine, m-xylilenediamine, 3-methylheptamethylenediamine, 1,3-bis(3-aminopropyl)tetramethyldisiloxane, etc. These known diamines can be used in an amount of 30% by mole or less based on the total amounts of the diamines. When the amount is more than 30% by mole, there is a tendency to lower thermal stability or heat melting properties of the resulting polymer.

It is preferable to use the acid component such as an aromatic dicarboxylic acid or a reactive derivative thereof and/or an aromatic tricarboxylic acid or a reactive derivative thereof in an amount of 80 to 120% by mole, more preferably 95 to 105% by mole, based on the total weight of the diamine including the diamine of the formula (III) or (IV). When the acid component and the diamine are used in equimolar amounts, a polymer having a high molecular weight can be obtained. When the amount of acid component is too much or too small is to the amount of diamine, the resulting polymer is lowered in the molecular weight to lower mechanical strength and heat resistance.

Reaction conditions for polycondensation reaction usable for conventional reactions of amines and acids can be applied in the present invention.

In the polycondensation reaction of an aromatic dicarboxylic acid or a reactive derivative thereof and/or an aromatic tricarboxylic acid or a reactive derivative thereof, and an aromatic diamine of the formula (III) or (IV), there can be used conventional processes (e.g. U.S. Pat. Nos. 3,505,288, 3,573,260, etc.).

By the use of two or more aromatic diamines, or two or more aromatic dicarboxylic acids or reactive derivatives thereof, or two or more aromatic tricarboxylic acids or reactive derivatives thereof, there can be obtained a polymer having different repeating units of the formula (I) or (II).

By the co-use of an aromatic dicarboxylic acid or a reactive derivative thereof and an aromatic tricarboxylic acid or a reactive derivative thereof, there can be obtained a polymer having different repeating units of the formula (I) or (II).

It is preferable that the polymer having repeating units of the formula (I) or (II) has a reduced viscosity of 0.2 to 2.0 dl/g measured at 30° C. in a 0.2% by weight dimethylformamide solution. When the reduced viscosity is too small, there is a tendency to lower heat resistance and mechanical strength. On the other hand, when the reduced viscosity is too large, there is a tendency to lower heat melting properties.

The adhesive of the present invention is preferably molded into a sheet and used effectively as a sheet-form adhesive.

The adhesive of the present invention can be dissolved in a solvent to give a varnish, which is impregnated in a heat-resistant thin cloth mat of fibers such as glass fibers and dried to give a fiber-reinforced film-form adhesive. Further, the adhesive of the present invention can be used in the form of a powder, which is pressed in practical used.

The adhesive of the present invention can be used as a varnish, which is coated on a an adherend, dried and heated for melting under pressure to bond to the adherend.

The adhesive of the present invention in the form of a varnish can be coated on one side or both sides of a polyimide film, followed by drying to give a polyimide film having a layer or layers of hot-melt adhesive of the present invention.

Such a polyimide film having one or two hot-melt adhesive layers thereon is particularly effective for providing a substrate for flexible printed circuit boards by bonding to metal foils by melt pressing with heating.

The melt pressing with heating can preferably be carried out at 50° to 400° C. and 1 to 1000 kg/cm$^2$ for 1 second to 30 minutes. More preferable conditions are the temperature of 200° to 350° C., the pressure of 10 to 500 kg/cm$^2$ and the period of 10 seconds to 10 minutes. Particularly preferable conditions are the temperature of 250° to 330° C., the pressure of 50 to 200 kg/cm$^2$ and the period of 30 seconds to 90 seconds.

The adhesive of the present invention may contain a fire retardant inorganic compound such as antimony trioxide, aluminum hydroxide, barium borate, etc.; one or more inorganic fillers such as silica, alumina, mica, titanium oxide, zirconia, calcium silicate, magnesium hydroxide, magnesium oxide, ion oxide, calcium carbonate, silicon carbide, boron nitride, silver powder, gold powder, copper powder, nickel powder, etc. in an amount of 70% by weight or less. When the amount of the inorganic filler is more than 70% by weight, the flow of adhesive becomes smaller and there is a tendency to lower adhesive strength.

Further, the adhesive of the present invention may contain one or more other fillers, stabilizing agents, surface active agents, solvents and the like depending on purposes.

As the metal foil, there can be used a copper foil, an aluminum foil, etc.

The adhesive of the present invention is also effective for providing a substrate for metal-based printed circuit boards by adhering metal foils to a metal plate via the adhesive of the present invention.

As the metal plate, there can be used an aluminum plate, a steel plate, a titanium plate, etc.

The present invention is illustrated by means of the following Examples, in which all percents are by weight unless otherwise specified.

EXAMPLE 1

In a four-necked flask equipped with a thermometer, a stirrer, a nitrogen introducing pipe, and a fractional distillation head, 205 g (0.5 mole) of 2,2-bis[4-(4-aminophenoxy)phenyl]propane was placed and dissolved in 705 g of N-methyl-2-pyrrolidone under nitrogen. The resulting solution was cooled to −10° C. Then, 105.3 g (0.5 mole) of trimellitic anhydride monochloride was added to the solution so as not to exceed −5° C. After dissolving trimellitic anhydride monochloride, 76 g of triethylamine was added so as not to exceed 5° C., followed by addition of 503 g of N-methyl-2-pyrrolidone. After stirring at room temperature for 1 hour, the reaction was carried out at 193° C. for 9 hours to complete imidazation.

The resulting reaction solution was poured into methanol to isolate a polymer. After drying, the polymer was dissolved again in N,N-dimethylformamide, followed by pouring into methanol to purify the polyamideimide, and drying under reduced pressure.

The polymer had a reduced viscosity ($\eta$ sp/c) of 0.89 dl/g measured at 30° C. in a 0.2% N,N-dimethylformaldehyde solution (hereinafter used in the same manner).

The resulting polymer powder was dissolved in N,N-dimethylformamide to give a 25% solution, which was cast on a glass plate to give a film of 100 μm thick. After drying at 100° C. for 1 hour, the film was peeled off from the glass plate. Then, the film was fixed on an iron frame and dried at 250° C. for 1 hour to give a sheet of 25 μm thick.

The resulting sheet was sandwiched between an aluminum plate of 2 mm thick and a copper foil of 35 μm and subjected to contact bonding at a pressure of 100 kg/cm² and 320° C. for 1 minute using a heating compression molding machine to give a metal-based copper-clad plate.

The polymer had repeating units of the formula:

solution, which was stirred at 60° C. for 1 day. The obtained reaction solution was isolated and purified in the same manner as described in Example 1. The resulting polyamideimide had a reduced viscosity of 0.73 dl/g.

A sheet was produced in the same manner as described in Example 1 and used as a heat-resistant adhesive to give a metal-based copper clad plate in the same manner as described in Example 1.

The polymer had repeating units of the formula:

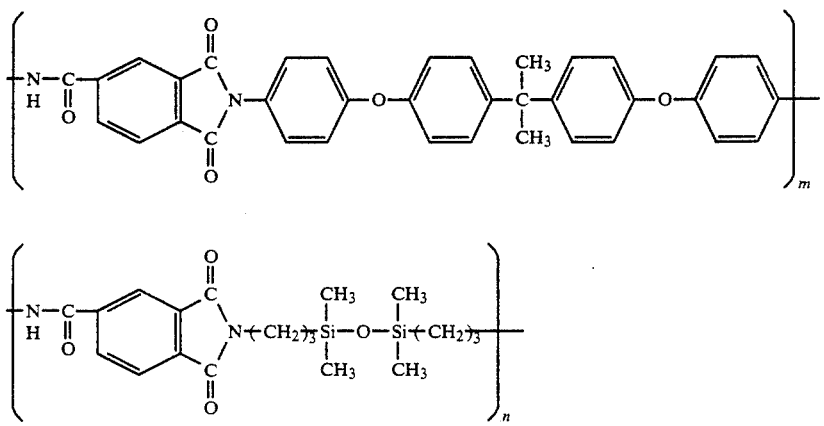

m:n = 9:1

Properties are shown in Table 1.

EXAMPLE 3

In a four-necked flask equipped with a thermometer, a stirrer, a nitrogen introducing pipe, and a condenser, 205 g (0.5 mole) of 2,2-bis[4-(4-aminophenoxy)phenyl]-

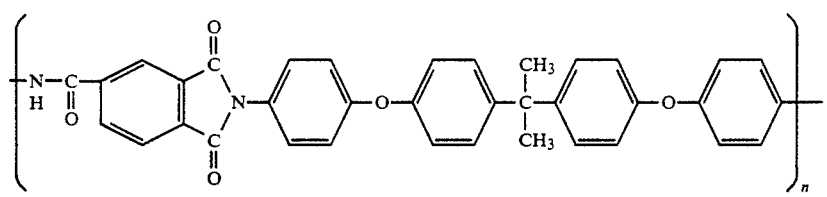

Properties are shown in Table 1.

EXAMPLE 2

In a four-necked flask equipped with a thermometer, a stirrer, a nitrogen introducing pipe, and a condenser, 147.6 g (0.36 mole) of 2,2-bis[4-(4-aminophenoxy)phenyl]propane and 9.92 g (0.04 mole) of 1,3-bis(aminopropyl)tetramethyldisiloxane and 34.8 g (0.6 mole) of propylene oxide were placed and dissolved in 564 g of N,N-dimethylacetamide under nitrogen. The resulting solution was cooled to 0° C. Then, 84.2 g (0.4 mole) of trimellitic anhydride monochloride was added to the solution at that temperature so as not to exceed 5° C. After stirring at room temperature for 3 hours, 200 g of acetic anhydride and 50 g of pyridine were added to the propane and 69.6 g (1.2 moles) of propylene oxide and dissolved in 1200 g of N-methyl-2-pyrrolidone under nitrogen. The solution was cooled to −5° C. Then, 101.5 g (0.5 mole) of isophthalic dichloride was added to the solution at that temperature so as not to exceed 20° C. Stirring was continued at room temperature for 3 hours.

The obtained reaction solution was isolated and purified in the same manner as described in Example 1. The resulting polyamide had a reduced viscosity of 1.0 dl/g.

A sheet was produced in the same manner as described in Example 1 and used as a heat-resistance adhesive to give a metal-based copper-clad plate in the same manner as described in Example 1.

The polymer had repeating units of the formula:

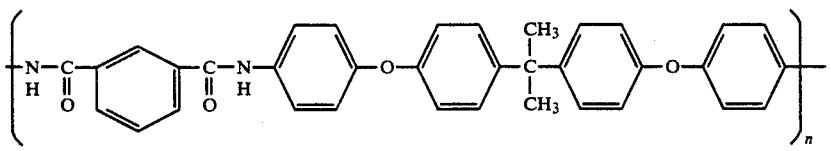

Properties are shown in Table 1.

EXAMPLE 4

The process of Example 1 was repeated except for using 216 g (0.5 mole) of bis[4-(4-aminophenoxy)phenyl]sulfone in place of 205 g (0.5 mole) of 2,2-bis[4-(4-aminophenoxy)phenyl]propane to give a polyamideimide. The obtained polyamideimide had a reduced viscosity of 0.66 dl/g.

A sheet was produced in the same manner as described in Example 1.

This sheet was sandwiched between an aluminum plate of 2 mm thick and a copper foil of 35 μm and subjected to contact bonding at 100 kg/cm$^2$ and 340° C. for 1 minute using a heating compression molding machine to give a metal-based copper-clad plate.

The polymer had repeating units of the formula:

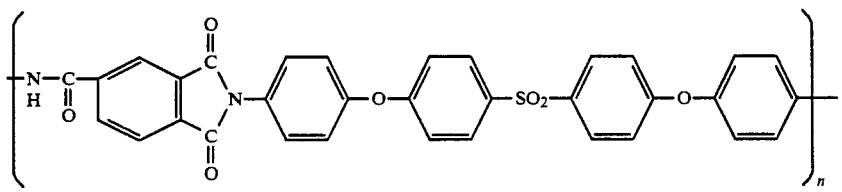

Properties are shown in Table 1.

EXAMPLE 5

The polyamideimide powder obtained in Example 1 was dissolved in diethylene glycol dimethyl ether to give a 25% solution, which was coated on a polyimide film (Kapton, a trade name, mfd. by E, I, du Pont de Nemours & Co., Inc.) of 50 μm thick to give a film of 25 μm thick after dried. After drying at 100° C. for 30 minutes and at 250° C. for 1 hour, there was obtained a polyimide film having a hot-melt adhesive layer thereon. Then, a copper foil of 35 μm thick was placed on the adhesive layer of the hot melt adhesive layer-having polyimide film and subjected to contact bonding at 50 kg/cm$^2$ and 320° C. for 1 minute using a heating compression molding machine to give a flexible copper-clad plate.

Properties are shown in Table 1.

EXAMPLE 6

A sheet of the adhesive obtained in Example 1 was sandwiched between a polyimide film (Kapton, a trade name, mfd. by E. I. du Pont de Nemours & Co., Inc.) of 50 μm thick and a copper foil of 35 μm thick and subjected to contact bonding at 50 kg/cm$^2$ and 320° C. for 1 minute using a heating compression molding machine to give a flexible copper-clad plate.

Properties are shown in Table 1.

COMPARATIVE EXAMPLE 1

A flexible copper-clad plate was obtained using a sheet-form acrylic adhesive (Pyralux-WA mfd. by E. I. du Pont de Nemours & Co., Inc.) in place of the adhesive film used in Example 6 under laminating conditions of 180° C., 30 kgf/cm$^2$ for 60 minutes.

Properties are shown in Table 1.

COMPARATIVE EXAMPLE 2

In a four-necked flask equipped with a thermometer, a stirrer, a nitrogen introducing pipe and a condenser, 205 g (0.5 mole) of 2,2-bis[4-(4-aminophenoxy)phenyl]propane was placed and dissolved in 705 g of N-methyl-2-pyrrolidone under nitrogen. To the solution, 110 g (0.5 mole) of pyromellitic dianhydride was added at room temperature and stirred for 20 hours.

The resulting polyamide acid varnish was cast on a glass plate to give a film of 25 μm thick after dried. After drying at 100° C. for 1 hour, the film was peeled off and fixed on an iron frame. Imidization was carried out at 250° C. for 2 hours and at 300° C. for 2 hours to give a polyimide sheet.

Using the resulting polyimide sheet as an adhesive, a flexible copper-clad plate was obtained in the same manner as described in Example 5 under contact bonding conditions of 350° C., 100 kg/cm$^2$ and 1 minute.

The polymer had repeating units of the formula:

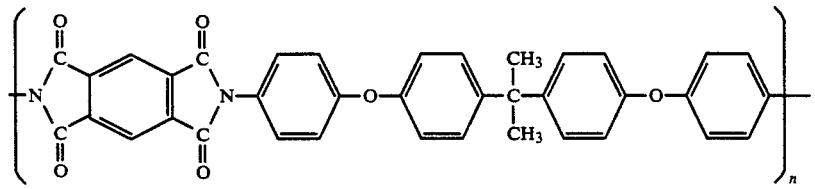

Properties are shown in Table 1.

TABLE 1

| Example | Peel strength (kgf/cm) | | Solder heat |
| No. | 23° C. | 150° C. | resistance |
| --- | --- | --- | --- |
| Example 1 | 2.2 | 1.9 | Good |
| Example 2 | 2.1 | 1.9 | Good |

TABLE 1-continued

| Example No. | Peel strength (kgf/cm) 23° C. | Peel strength (kgf/cm) 150° C. | Solder heat resistance |
|---|---|---|---|
| Example 3 | 2.0 | 1.7 | Good |
| Example 4 | 1.4 | 1.4 | Good |
| Example 5 | 2.4 | 2.2 | Good |
| Example 6 | 2.0 | 1.8 | Good |
| Comparative Example 1 | 2.2 | 0.5 | Swelled |
| Comparative Example 2 | 0.3 | 0.3 | Good |

Note)
(1) Peel strength was measured according to JIS C 6481: a test method for copper-clad laminates for printed circuit.
(2) Solder resistance was evaluated by observing surface appearance after dipping a sample in a solder bath heated at 260° C. for 1 minute (JIS C 6481).

EXAMPLE 7

In a four-necked flask equipped with a thermometer, a stirrer, a nitrogen introducing pipe and a fractional distillation head, 146 g (0.5 mole) of 1,3-bis(3-aminophenoxy)benzene was placed under nitrogen and dissolved in 705 g of N-methyl-2-pyrrolidone. The resulting solution was cooled to $-10°$ C. Then, 105.3 g (0.5 mole) of trimellitic anhydride monozhloride was added to the solution at that temperature so as not to exceed $-5°$ C. After dissolving the trimellitic anhydride monochloride, 76 g of triethylamine was added to the solution so as not to exceed 5° C., followed by addition of 503 g of N-methyl-2-pyrrolidone. After stirring at room temperature for 1 hour, the reaction was carried out at 190° C. for 9 hours to complete imidization.

The resulting reaction solution was poured into methanol to isolate a polymer. After drying, the polymer was dissolved in N,N-dimethylformamide again, and poured into metanol to purify the polyamideimide, followed by drying under reduced pressure.

The polymer had a reduced viscosity ($\eta$ sp/c) of 0.65 dl/g.

The obtained polymer powder was dissolved in N,N-dimethylformamide to give a 25% solution, which was cast on a glass plate to form a film of 100 μm thick. After drying at 100° C. for 1 hour, the film was peeled from the glass plate and fixed on an iron frame, followed by drying at 250° C. for 1 hour to give a sheet of 25 μm thick.

The resulting sheet was sandwiched between an aluminum plate of 2 mm thick and a copper foil of 35 μm thick and subjected to contact bonding at 100 kg/cm² and 290° C. for 1 minute using a heating compression molding machine to give a metal-based copper-clad plate.

The polymer had repeating units of the formula:

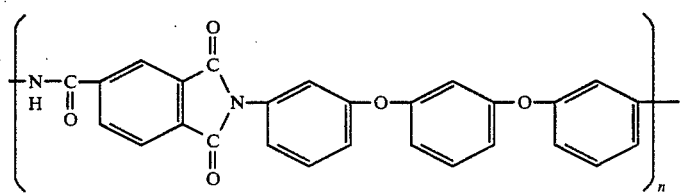

Properties are shown in Table 2.

EXAMPLE 8

In a four-necked flask equipped with a thermometer, a stirrer, a nitrogen introducing pipe, and a condenser, 123.8 g (0.36 mole) of 4,4'-[1,3-phenylenebis(1-methylethylidene)]bisaniline, 9.92 g ,0.04 mole) of 1,3-bis-(aminopropyl)tetramethyldisiloxane and 34.8 g (0.6 mole) of propylene oxide were placed under nitrogen, and dissolved in 564 g of propylene oxide. The solution was cooled to 0° C. Then, 84.2 g (0.4 mole) of trimellitic anhydride monochloride was added at that temperature so as not to exceed 5° C. After stirring at room temperature for 3 hours, 200 g of acetic anhydride and 5 ) g of pyridine were added to the solution and stirred at 60° C. for 1 day. The resulting reaction solution was isolated and purified in the same manner as described in Example 1. The resulting polyamideimide had a reduced viscosity of 0.70 dl/g.

A sheet was formed in the same manner as described in Example 7 and used as a heat-resistant adhesive to give a metal-based copper-clad plate in the same manner as described in Example 7.

The polymer had repeating units of the formula:

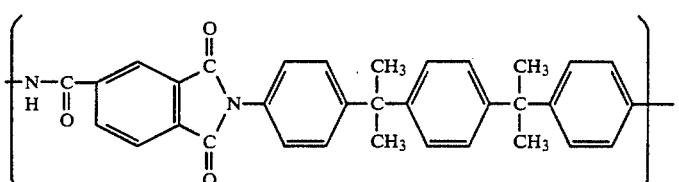

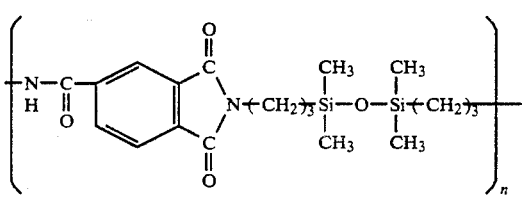

m:n = 9:1

Properties are shown in Table 2.

EXAMPLE 9

In a four-necked flask equipped with a thermometer, a stirrer, a nitrogen introducing pipe and a condenser, 146 g (0.5 mole) of 1,3-bis(3-aminophenoxy)benzene and 69.6 g (1.2 moles) of propylene oxide were placed under nitrogen, and dissolved in 1200 g of N-methyl-2-pyrrolidone. The resulting solution was cooled to $-5°$ C. Then, 101.5 g (0.5 mole) of isophthalic dichloride was added to the solution at that temperature so as not to exceed 20° C. The stirring was continued at room temperature for 3 hours. The resulting reaction solution was isolated and purified in the same manner as described in Example 1. The resulting polymer had a reduced viscosity of 1.2 dl/g.

A sheet was formed in the same manner as described in Example 7 and used as a heat-resistant adhesive to give a metal-based copper-clad plate in the same manner as described in Example 7.

The polymer had repeating units of the formula:

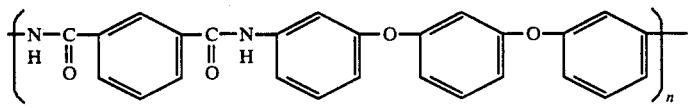

Properties are shown in Table 2.

EXAMPLE 10

A polyamide was prepared in the same manner as described in Example 9 except for using 172 g (0.5 mole) of 4,4'-[1,3-phenylenebis(1-methylethylidene)]bisaniline in place of 146 g (0.5 mole) of 1,3-bis(3-aminophenoxy)benzene. The resulting polyamide had a reduced viscosity of 0.96 dl/g.

A sheet was formed in the same manner as described in Example 7 and used as a heat-resistant adhesive to give a metal-based copper-clad plate in the same manner as described in Example 7.

The polymer had repeating units of the formula:

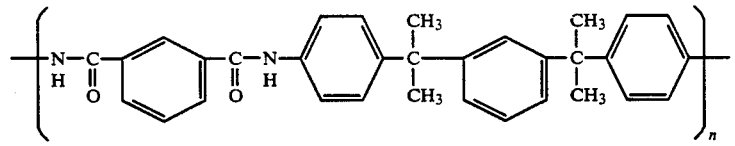

Properties are shown in Table 2.

EXAMPLE 11

The polyamideimide powder obtained in Example 7 was dissolved in diethylene glycol dimethyl ether to give a 25% solution, which was coated on a polyimide film (Kapton, a trade name, mfd. by E. I. du Pont de Nemours & Co., Inc.) of 50 μm thick to give a film of 25 μm thick after dried. After drying at 100° C. for 30 minutes and at 250° C. for 1 hour, there was obtained a polyimide film having a hot-melt adhesive layer thereon. Then, a copper foil of 35 μm thick was placed or the adhesive layer of the hot-melt adhesive layer-having polyimide film and subjected to contact bonding at 50 kg/cm² and 290° C. for 1 minute using a heating compression molding machine to give a flexible copper-clad plate.

Properties are shown in Table 2.

EXAMPLE 12

A sheet of the adhesive obtained in Example 7 was sandwiched between a polyimide film Kapton, a trade name, mfd. by E. I. du Pont de Nemours & Co., Inc.) of 50 μm and a copper foil of 35 μm thick and subjected to contact bonding at 50 kg/cm² and 300° C. for 1 minute using a heating compression molding machine to give a flexible copper-clad plate.

Properties are shown in Table 2.

COMPARATIVE EXAMPLE 3

In a four-necked flask equipped with a thermometer, a stirrer, a nitrogen introducing pipe, and a condenser, 100 g (0.5 mole) of 4,4'-diaminodiphenyl ether was placed under nitrogen, and dissolved in 705 g of N-methyl-2-pyrrolidone. To the solution, 110 g (0.5 mole) of pyromellitic dianhydride was added at room temperature and stirred for 20 hours.

The resulting polyamide acid varnish was cast on a glass plate to give a film of 25 μm thick after dried. After drying at 100° C. for 1 hour, the film was peeled off and fixed on an iron frame. Imidization was carried out at 250° C. for 2 hours and at 300° C. for 2 hours to give a polyimide sheet.

The polyimide sheet was contact bonded with heating in the same manner as described in Example 11 at 350° C. and 100 kg/cm² for 1 minute. But since the polyimide sheet was not melted, it did not bonded to the copper foil, resulting in failing to obtain the desired flexible copper-clad plate.

The polymer had repeating units of the formula:

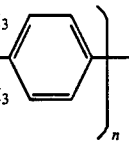

TABLE 2

| Example No. | Peel strength (kgf/cm) | | Solder heat resistance |
|---|---|---|---|
| | 23° C. | 150° C. | |
| Example 7 | 2.2 | 1.5 | Good |

TABLE 2-continued

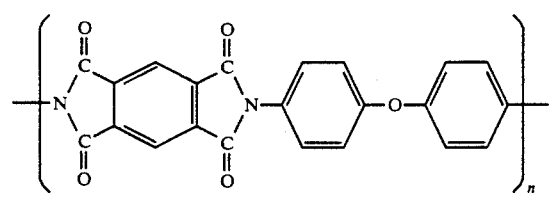

| Example No. | Peel strength (kgf/cm) 23° C. | Peel strength (kgf/cm) 150° C. | Solder heat resistance |
| --- | --- | --- | --- |
| Example 8 | 1.8 | 1.6 | Good |
| Example 9 | 2.1 | 1.5 | Good |
| Example 10 | 1.6 | 1.3 | Good |
| Example 11 | 2.3 | 1.9 | Good |
| Example 12 | 2.0 | 1.7 | Good |
| Comparative Example 3 | Not bonded | Not bonded | — |

The test conditions are the same as those described in Table 1.

As mentioned above, the hot-melt adhesive of the present invention comprises a polymer having excellent heat resistance and melting properties, so that it can be melt bonded with heating in a short time, and shows excellent adhesive strength upto high temperatures and slight deterioration even after allowed to stand at high temperatures.

The hot-melt adhesive of the present invention can be used in the form a sheet. Further, since it can be dissolved in a solvent, it can be used as a varnish, which is coated on a substrate such as a polyimide film, followed by drying to give an adhesive-coated polyimide film. It can be melt bonded with heating to other adherend.

Further, using such a hot-melt adhesive, there can be obtained substrates for printed circuit boards excellent in heat resistance and adhesive strength, and exhibiting excellent properties even if exposed to high temperatures.

What is claimed is:

1. A hot-melt adhesive comprising at least one member selected from the group consisting of a polymer having repeating units of the formula:

(I)

wherein $R_1$, $R_2$, $R_3$ and $R_4$ are independently a hydrogen atom, a lower alkyl group, a lower alkoxy group or a halogen atom; X is the same or different group in every repeating unit and is a direct link, —O—, —S—, $$-\overset{O}{\underset{\|}{C}}-, -SO_2-, -\overset{O}{\underset{\|}{S}}-, \text{cyclohexyl}, \text{cyclohexyl}, \text{or} -\overset{R_5}{\underset{R_6}{C}}-;$$

$R_5$ and $R_6$ are independently a hydrogen atom, a lower alkyl, group, a trifluoromethyl group, a trichloromethyl group or a phenyl group; Y is the same or different group in every repeating unit and represent by the formula:

$$-\overset{}{\underset{H}{N}}-\overset{O}{\underset{\|}{C}}-Ar-\overset{O}{\underset{\|}{C}}-\overset{}{\underset{H}{N}}- \text{ or } -\overset{}{\underset{H}{N}}-\overset{O}{\underset{\|}{C}}-Ar'\overset{C}{\underset{C}{\diagdown}}N-;$$

Ar is a divalent aromatic group; and Ar' is a trivalent aromatic group, and a polymer having repeating units of the formula:

(II)

wherein m is zero or an integer of 1 to 4; $R_1'$ is a lower alkyl group; $R_2'$ is a lower alkyl group or a halogen atom; X' is the same or different group in every repeating unit and is a direct link, —O— or $$-\overset{R_5'}{\underset{R_6'}{C}}-;$$

$R_5'$ and $R_6'$ are independently a hydrogen atom, a lower alkyl group, a trifluoromethyl group or a phenyl group; and Y is as defined above.

2. A hot-melt adhesive according to claim 1, wherein the polymer has repeating units of the formula (I).

3. A hot-melt adhesive according to claim 2, wherein the polymer has repeating units of the formula:

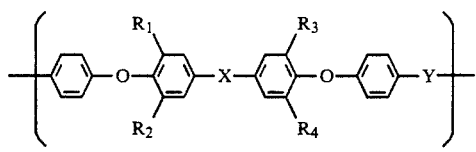

4. A hot-melt adhesive according to claim 2, wherein the polymer has repeating units of the formula:

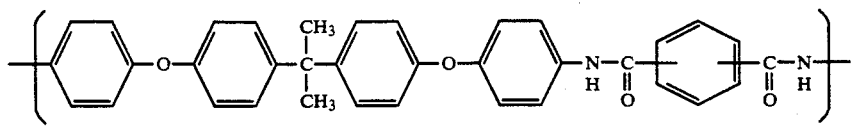

5. A hot-melt adhesive according to claim 1, wherein the polymer has repeating units of the formula (II).

6. A hot-melt adhesive according to claim 5, wherein the polymer has repeating units of the formula:

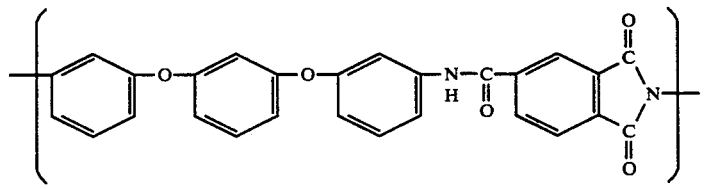

7. A hot-melt adhesive according to claim 5, wherein the polymer has repeating units of the formula:

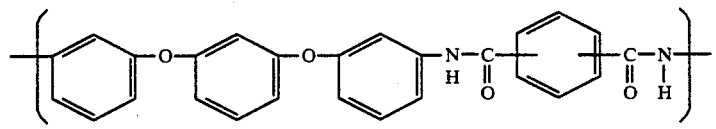

8. A hot-melt adhesive according to claim 5, wherein the polymer has repeating units of the formula:

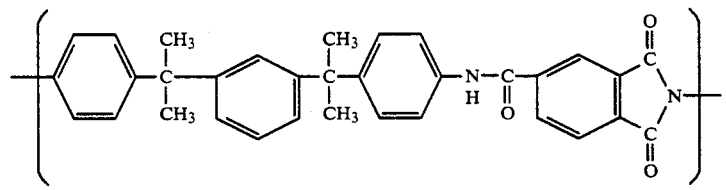

9. A hot-melt adhesive according to claim 5, wherein the polymer has repeating units of the formula:

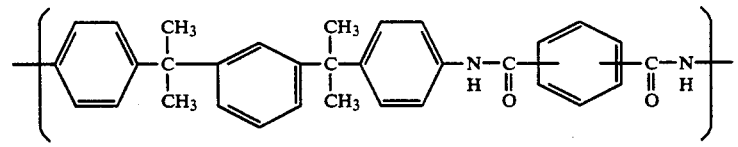

10. A hot-melt adhesive according to claim 2, which is in the form of a sheet.

11. A hot-melt adhesive according to claim 5, which is in the form of a sheet.

12. A polyimide film having on one side or both sides thereof a layer or layers of the hot-melt adhesive of claim 1.

13. A polyimide film having on one side or both sides thereof a layer or layers of the hot-melt adhesive of claim 2.

14. A polyimide film according to claim 13, wherein the hot-melt adhesive comprises a polymer having repeating units of the formula:

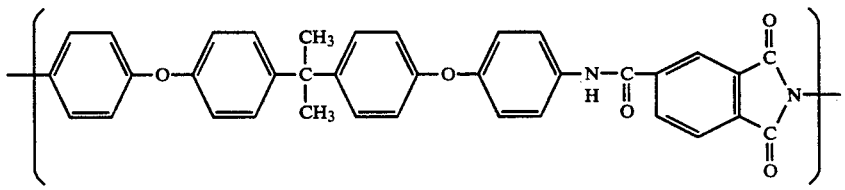

15. A polyimide film according to claim 13, wherein the hot-melt adhesive comprises a polymer having repeating units of the formula:

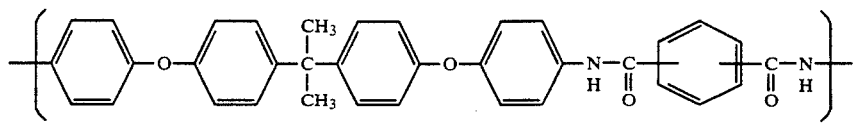

16. A polyimide film having on one side or both sides thereof a layer or layers of the hot-melt adhesive of claim 5.

17. A polyimide film according to claim 16, wherein the hot-melt adhesive comprises a polymer having repeating units of the formula:

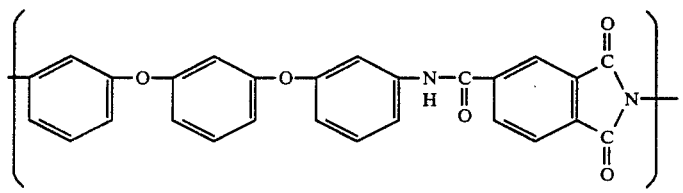

18. A polyimide film according to claim 16, wherein the hot-melt adhesive comprises a polymer having repeating units of the formula:

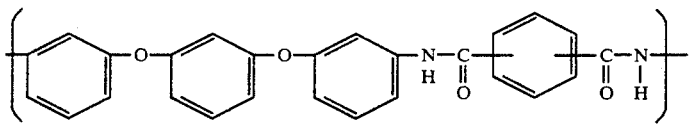

19. A polyimide film according to claim 16, wherein the hot-melt adhesive comprises a polymer having repeating units of the formula:

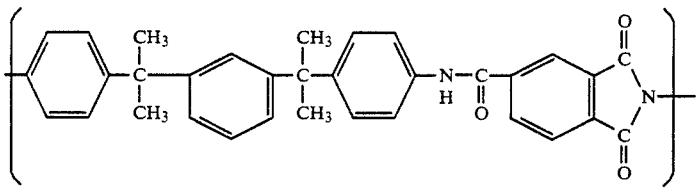

20. A polyimide film according to claim 16, wherein the hot-melt adhesive comprises a polymer having repeating units of the formula:

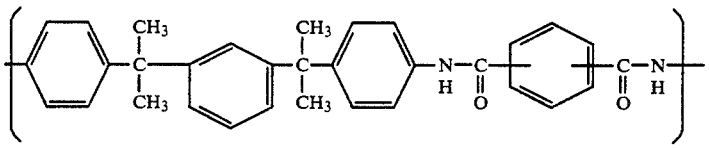

21. A substrate for flexible printed circuit boards obtained by adhering metal foils to a polyimide film via a layer of hot-melt adhesive of claim 1.

22. A substrate for flexible printed circuit boards obtained by adhering metal foils to a polyimide film via a layer of hot-melt adhesive of claim 2.

23. A substrate for flexible printed circuit boards obtained by adhering metal foils to a polyimide film via a layer of hot-melt adhesive of claim 5.

24. A substrate for flexible printed circuit boards according to claim 22, wherein the hot-melt adhesive comprises a polymer having repeating units of the formula:

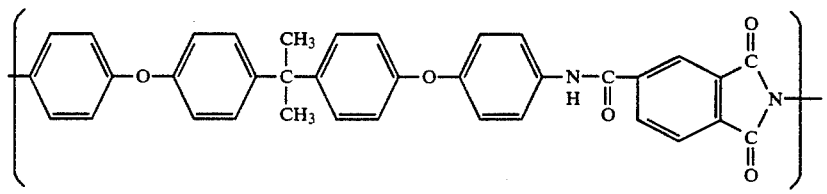

25. A substrate for flexible printed circuit boards according to claim 22, wherein the hot melt adhesive comprises a polymer having repeating units of the formula:

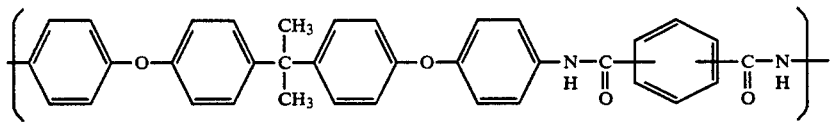

26. A substrate for flexible printed circuit boards according to claim 23, wherein the hot-melt adhesive comprises a polymer having repeating units of the formula:

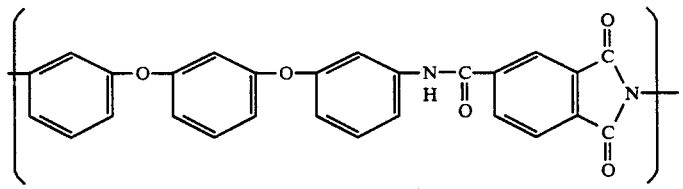

27. A substrate for flexible printed circuit boards according to claim 23, wherein the hot-melt adhesive comprises a polymer having repeating units of the formula:

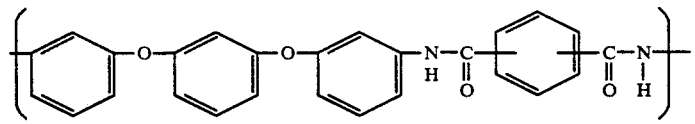

28. A substrate for flexible printed circuit boards according to claim 23, wherein the hot-melt adhesive comprises a polymer having repeating units of the formula:

29. A substrate for flexible printed circuit boards according to claim 23, wherein the hot-melt adhesive comprises a polymer having repeating units of the formula:

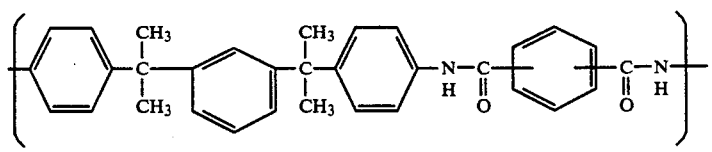

30. A substrate for melt-based printed circuit boards obtained by adhering metal foils to a metal plate via a layer of hot-melt adhesive of claim 1.

31. A substrate for metal-based printed circuit boards obtained by adhering metal foils to a metal plate via a layer of hot-melt adhesive of claim 2.

32. A substrate for metal-based printed circuit boards obtained by adhering metal foils to a metal plate via a layer of hot-melt adhesive of claim 5.

33. A substrate for metal-based printed circuit boards according to claim 31, wherein the hot-melt adhesive comprises a polymer having repeating units of the formula:

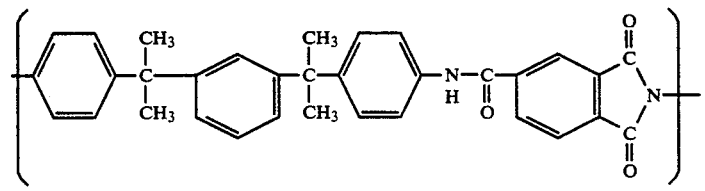

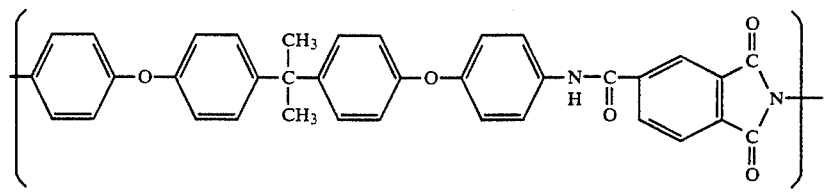

34. A substrate for metal-based printed circuit boards according to claim 31, wherein the hot-melt adhesive comprises a polymer having repeating units of the formula:

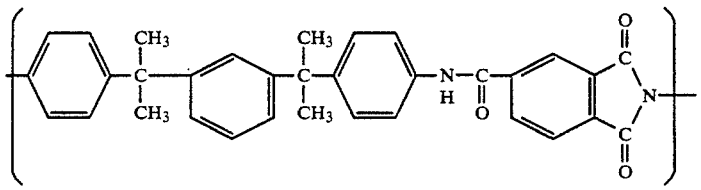

35. A substrate for metal-based printed circuit boards according to claim 32, wherein the hot-melt adhesive comprises a polymer having repeating units of the formula:

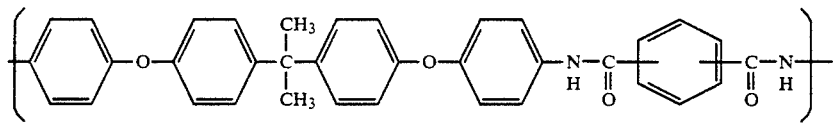

36. A substrate for metal-based printed circuit boards according to claim 32, wherein the hot-melt adhesive comprises a polymer having repeating units of the formula:

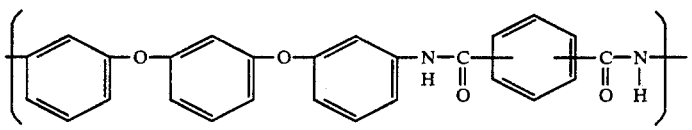

37. A substrate for metal-based printed circuit boards according to claim 32, wherein the hot-melt adhesive comprises a polymer having repeating units of the formula:

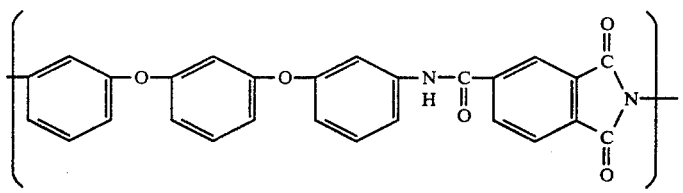

38. A substrate for metal-based printed circuit boards according to claim 32, wherein the hot-melt adhesive comprises a polymer having repeating units of the formula:

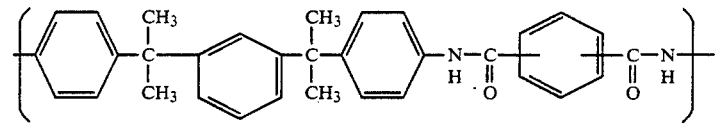

39. A hot-melt adhesive according to claim 1, wherein Y is the same or different group in every repeating unit and is represented by the formula:

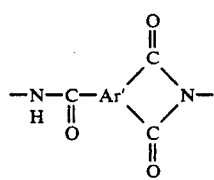

wherein Ar' is a trivalent aromatic group selected from the group consisting of

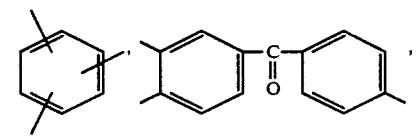

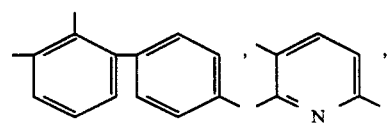

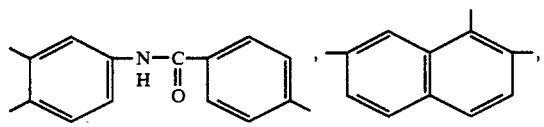

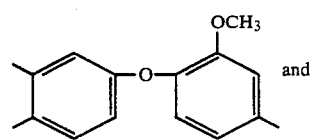

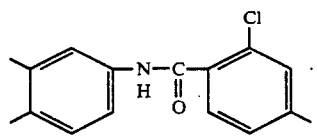

40. A hot-melt adhesive according to claim 1, wherein X is the same or different group in every repeating unit and is a direct link, —O—, —S—,

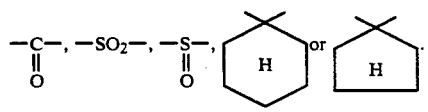

41. A hot-melt adhesive according to claim 1, wherein Ar is a divalent aromatic group selected from the group consisting of

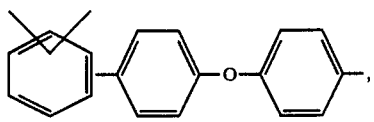

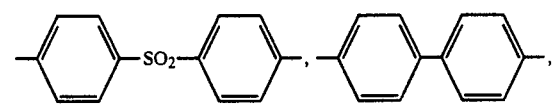

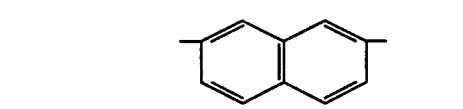

and wherein Ar' is a trivalent aromatic group selected from the group consisting of

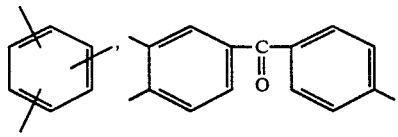

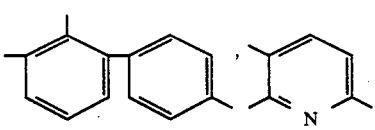

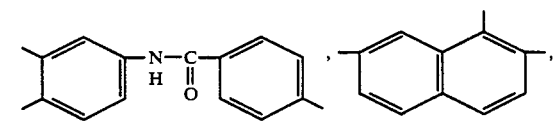

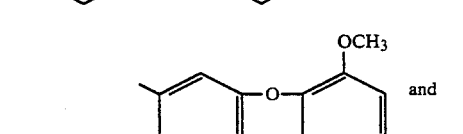

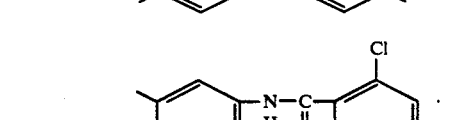

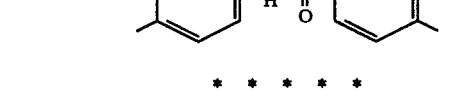

* * * * *